United States Patent [19]

Su et al.

[11] Patent Number: 5,410,122
[45] Date of Patent: Apr. 25, 1995

[54] USE OF ELECTROSTATIC FORCES TO REDUCE PARTICLE CONTAMINATION IN SEMICONDUCTOR PLASMA PROCESSING CHAMBERS

[75] Inventors: Yuh-Jia Su, Cupertino; Anand Gupta, San Jose; Graham W. Hills, Los Gatos; Joseph Lanucha, Sunnyvale, all of Calif.

[73] Assignee: Applied Materials, Inc., Santa Clara, Calif.

[21] Appl. No.: 31,800

[22] Filed: Mar. 15, 1993

[51] Int. Cl.$^6$ ............... B23K 10/00; H01L 21/00; B44C 1/22
[52] U.S. Cl. .............. 219/121.44; 219/121.43; 156/345; 204/298.34
[58] Field of Search ............ 219/121.43, 121.44, 219/121.45; 156/345, 643, 646; 204/298.38, 192.32, 298.37, 298.34

[56] References Cited

U.S. PATENT DOCUMENTS

| | | | |
|---|---|---|---|
| 3,617,463 | 11/1971 | Gregor et al. | 204/298 |
| 4,786,352 | 11/1988 | Benzing | 156/345 |
| 4,926,439 | 5/1990 | Johnson et al. | 373/10 |
| 4,951,601 | 8/1990 | Mayden et al. | 118/719 |
| 4,959,841 | 9/1990 | Johnson et al. | 373/10 |
| 5,202,008 | 4/1993 | Talieh et al. | 204/192.32 |
| 5,225,024 | 7/1993 | Hanley et al. | 156/345 |
| 5,286,297 | 2/1994 | Moslehi et al. | 118/723 E |
| 5,298,720 | 3/1994 | Cuomo et al. | 219/121.43 |

OTHER PUBLICATIONS

Selwyn, "Particle trapping phenomena in radio frequency plasmas", *Applied Physics Letter*, 57, Oct. 29, 1990.

Selwyn, "Plasma particulate contamination control II. Self–cleaning tool design", *Journal of Vacuum Science and Technology*, 10(4), Jul./Aug. 1992.

*Primary Examiner*—Mark H. Paschall
*Attorney, Agent, or Firm*—Robert W. Mulcahy; Peter J. Sgarbossa

[57] ABSTRACT

Particles are repelled from the upper face of a wafer in a plasma chamber by inducing positive or negative charges on the substrate without generating a gas plasma above the substrate. The charges are induced in the substrate by bringing a conductive sheet carrying a DC voltage close to the underside of the substrate. The particle repelling effect may be enhanced by inducing alternating positive and negative charges in the substrate. This can be done by switching the polarity of the DC voltage applied to the conductive sheet, or alternatively by moving an actuator to repetitively ground and isolate the substrate from the chamber.

13 Claims, 4 Drawing Sheets

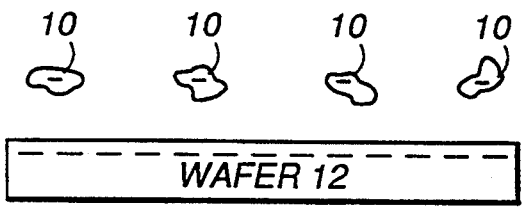
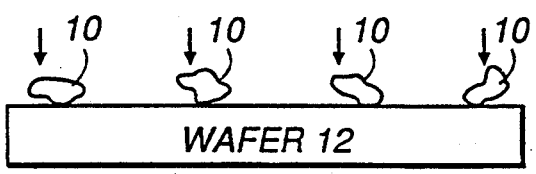
Figure 1A                Figure 1B
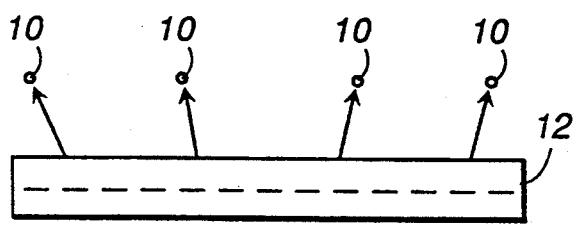
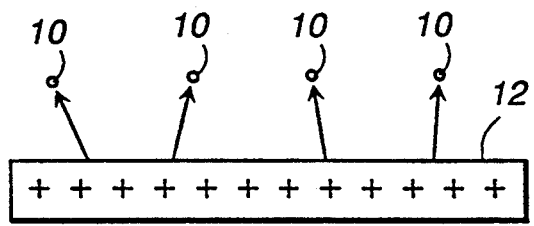
Figure 2A                Figure 2B
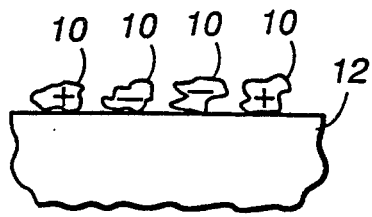
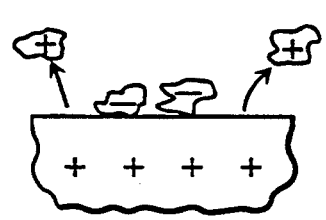
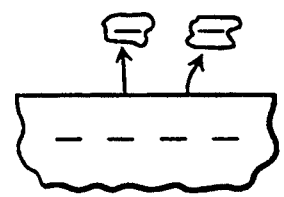
Figure 3A          Figure 3B          Figure 3C
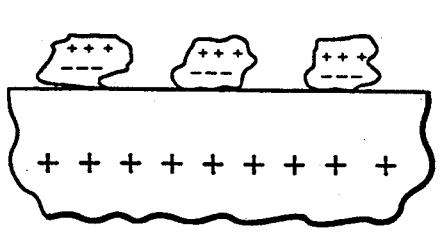
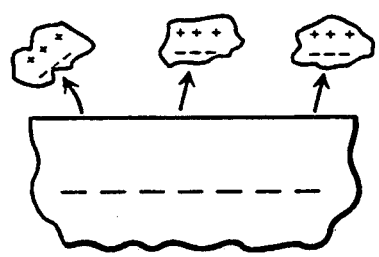
Figure 4A                Figure 4B

USE OF ELECTROSTATIC FORCES TO REDUCE PARTICLE CONTAMINATION IN SEMICONDUCTOR PLASMA PROCESSING CHAMBERS

BACKGROUND OF THE INVENTION

This application relates to control of contaminating particles in materials processing.

In a sputter or reactive ion etching or chemical vapor deposition apparatus used in semiconductor manufacturing, a semiconductor wafer is placed between two electrodes which are driven by a radio frequency (RF) AC voltage source. (Ordinarily the wafer is placed directly over one electrode and a substantial distance from the other electrode.) A reactant gas is released into the chamber in the area above the wafer. Because the reactant molecules are relatively large and immobile, they cannot move in response to the rapidly fluctuating electric fields. However, the electrons associated with the reactant molecules are relatively mobile. As a result, if the AC electric fields are sufficiently intense, electrons are stripped from the reactant molecules, forming a gas plasma of free electrons and positive reactant ions. This plasma is highly conductive because it contains a large number of free carriers, and therefore is essentially an equipotential region.

When the RF AC source is first turned on, the wafer and electrode surfaces contain no charge. During the first half of the AC cycle when the electrode beneath the wafer has a negative voltage, the negative voltage causes positive ions from the plasma to strike the wafer surface, removing electrons and leaving behind a positive charge on the surface. During the second half of the AC cycle, the electrode beneath the wafer has a positive voltage, and the wafer surface attracts and collects electrons. The mass of the electrons is much smaller than that of ions, and the electric field accelerates them more rapidly to the electrode surface. As a result, after one AC cycle, many more electrons are collected on the wafer surface than ions. As more cycles transpire, the wafer surface continues to build negative charge.

This accumulation of negative charge causes the wafer to develop a negative DC voltage relative to the plasma. As a result, during a larger part of the AC cycle the wafer voltage is more negative than the plasma, reducing the time during which electrons are attracted to the wafer and increasing the time during which positive ions are attracted to the wafer. Ultimately, the wafer charges to a negative voltage nearly equal to the peak voltage of the AC signal, and the system reaches a steady state in which an equal number of positive ions and electrons strike the electrode during each complete signal period. The flow of ions is relatively steady throughout the cycle, and is equalized by a brief spike of electron flow during the peak portion of the AC cycle. The negative steady-state DC offset voltage between the wafer and plasma is known as the "self bias voltage".

Because the wafer is charged to a negative self bias voltage, ions which reach the edge of the region between the plasma above the wafer (the "plasma sheath") are accelerated onto the wafer surface and come to rest within the semiconductor lattice of the wafer surface. Since the plasma is an equipotential region, ions within the plasma are not influenced by the negative voltage of the wafer; only those ions which happen to reach the sheath boundary due to random motion are accelerated into the wafer. Thus the ion flow mechanism is diffusive in nature.

Particle contamination is becoming an increasingly serious limitation in high quality materials processing such as semiconductor manufacturing. In the semiconductor manufacturing area, it has been estimated that as much as 70–80% of all wafer contamination is caused by particles. Thus, substantial reductions in defect rates may be achieved by reductions in particle contamination.

A typical plasma apparatus includes many potential sources of contaminating particles, such as: cracked or flaking materials (e.g., quartz) or films (e.g., dielectric films) inside the chamber, polymers collecting on the walls of the chamber over time, small metal spheres created by arcing between metal surfaces, and incidental contact or rubbing inside the chamber during wafer handling. Once particles from any of these sources are released into the processing chamber during processing, they enter the gas plasma, and ultimately land on and contaminate the wafer surface.

Because free electrons within the plasma have a much higher mobility than positive ions, any materials floating within the plasma, e.g. particles, are bombarded with more electrons than ions, and will build up a negative surface charge.

Gravitational forces pull the particles in the plasma down in the direction of the wafer; however, when the RF AC source is engaged during the plasma process, this gravitational force is equalized by a repulsive electrostatic force between the negative charges accumulated on the wafer and particle surfaces. As a result, as shown in FIG. 1A, particles 10 float above the wafer 12 during the plasma process. (The total charge accumulated on a particle is roughly proportional to the surface area and mass of the particle, as a result, large particles and small particles both tend to float approximately the same distance above the surface of the wafer.) Selwyn, "Particle trapping phenomena in radio frequency plasmas" (Applied Physics Letter 57, Oct. 29, 1990) demonstrated that a typical wafer chamber generates (electric field) equipotential wells above the wafer which trap particles above the wafer. Selwyn photographed particles floating above wafers using scattered laser light.

Although the balance of gravitational and electrostatic forces prevents particle contamination while the RF power is on, after the RF power is turned off, the negative charge on the wafer dissipates, and, as shown in FIG. 1B, as a result the particles 10 fall onto and contaminate the wafer 12.

Selwyn, "Plasma particulate contamination control II. Self-cleaning tool design" (*Journal of Vacuum Science and Technology*, 10(4), July/August 1992) discusses this effect and suggests that the wafer electrode can be grooved to create channels in the equipotential well leading away from the wafer, allowing particles to flow out away from the wafer during plasma processing.

SUMMARY OF THE INVENTION

The invention repels particles from the upper surface of a substrate in a plasma chamber by inducing positive or negative charge, or alternating charge, on the substrate without generating a gas plasma above the substrate. The repelled particles are then swept away from the substrate by a horizontal force generated, for example, by a high gas flow rate or by a magnetic field.

In particular embodiments, charges are induced in the substrate by bringing a conductive sheet carrying a DC voltage close to the underside of the substrate. If the conductive sheet is close enough to the substrate, the capacitive coupling between the sheet and the substrate will be substantially stronger than the coupling between the substrate and the walls of the chamber. In this configuration, if the substrate is electrically isolated from the chamber, the upper surface of the substrate will accumulate a charge of the same polarity as the DC voltage applied to the conductive sheet. Alternatively, if the substrate is electrically connected to the chamber (for example by contacting the substrate with an electrically grounded actuator), the substrate will accumulate a charge of opposite polarity to the DC voltage applied to the conductive sheet.

Alternating positive and negative charges can be induced by switching the polarity of the DC voltage applied to the conductive sheet, or alternatively by moving an actuator to electrically connect and disconnect the substrate to and from the (grounded) walls of the chamber.

BRIEF DESCRIPTION OF THE DRAWING

FIGS. 1A and 1B illustrate particles levitating over a wafer being processed and settling on the wafer after processing.

FIGS. 2A and 2B illustrate electrostatic repulsion of particles from a wafer when the wafer is induced with positive or negative charge.

FIGS. 3A, 3B and 3C illustrate electrostatic repulsion of particles with net positive or negative charge.

FIGS. 4A and 4B illustrate electrostatic repulsion caused by conductive biasing of particles.

DESCRIPTION OF THE PREFERRED EMBODIMENTS

Figure 5A:
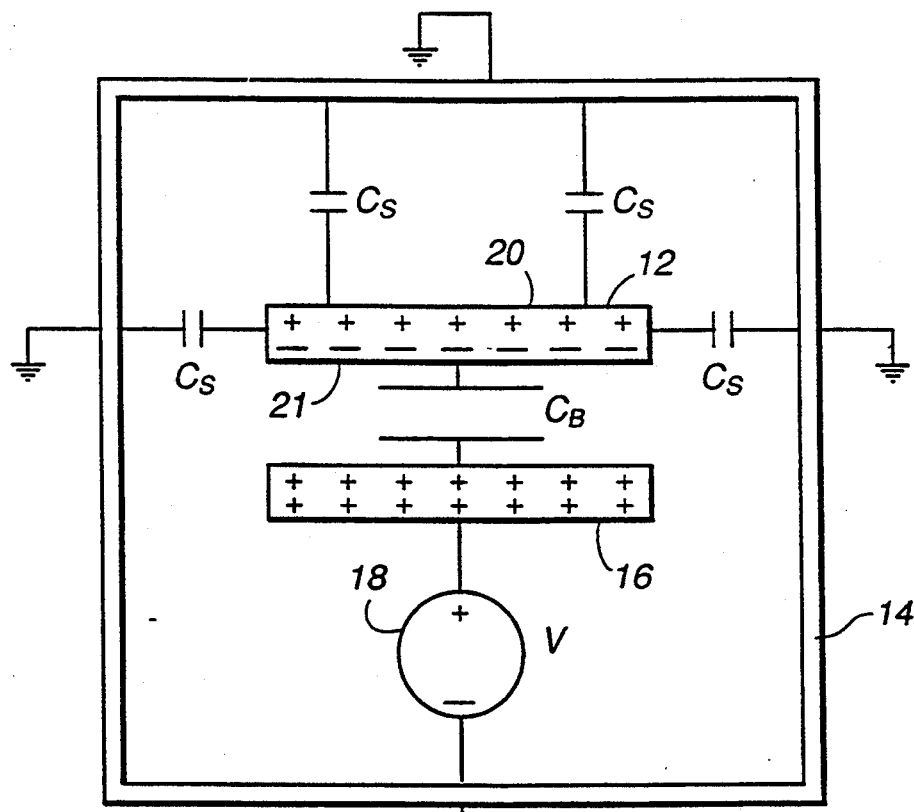
FIGS. 5A and 5B diagrammatically illustrate techniques for inducing positive or negative charge on the surface of a wafer.

As pointed out above, during a plasma process, particles are repelled from the surface of a wafer because negative charges are induced in both the particles and wafer. U.S. patent application Ser. No. 07/899,539 takes advantage of this effect by changing the air flow and pressure in the chamber before ending the plasma process, thereby removing particles from the chamber before they land on the wafer. U.S. patent application Ser. No. 07/980,828 takes a different approach; after the plasma process is ended, a second plasma is formed from an inert gas, and while this plasma is active (and the particles are therefore levitating above the wafer), the particles are swept out of the chamber.

It has been observed, however, that even when the plasma is turned off, if the wafer is induced with charge of either polarity, particles are repelled from the surface of the wafer. Thus, as shown in FIG. 2A, if a negative charge is induced on the wafer 12, particles 10 are repelled from the wafer 12 and can be seen bouncing away from the wafer. As shown in FIG. 2B, particles 10 are also repelled when a positive charge is induced on the wafer 12.

Those particles which are rejected from the wafer as shown in FIGS. 2A and 2B are primarily directed upwards away from the wafer; very little horizontal force is generated. As a result, the particles have been observed to bounce up and down above the wafer in an essentially vertical direction. To sweep these particles away from the wafer, a horizontal force must be applied, for example by flowing an inert gas through the chamber at a rate substantially above the flow rate used during plasma processing.

One possible explanation for the effect illustrated in FIGS. 2A and 2B is that the particles 10 which rest on the wafer carry a net charge. Thus, as illustrated in FIG. 3A, those particles resting on the wafer may carry positive (+) or negative (−) charges. These charges are induced on the particles by contact with the plasma and by abrasion with the surfaces of the chamber. These charges are not easily removed in vacuo by mere contact with the wafer.

As shown in FIG. 3B, when a positive charge is induced in the wafer, those particles which are positively charged are repelled from the surface of the wafer. Similarly, when a negative charge is induced in the wafer, those particles which are negatively charged are repelled from the surface of the wafer. Thus, to clear the wafer of particles, first the wafer is charged positively (as shown in FIG. 3B), and then a horizontal force is used to sweep the repelled (positively charged) particles out of the chamber. Once the positively charged particles are removed from the chamber, the wafer is charged negatively (as shown in FIG. 3C), repelling the negatively charged particles and allowing them to be swept out of the chamber. (It may be the case that most particles are negatively charged, in which case the wafer should be charged negatively first.)

Another explanation of the effect illustrated in FIGS. 2A and 2B is that the particles 10 which rest on the surface of the wafer 12 become electrically biased due to conduction and therefore are repelled from the surface of the wafer when the charge on the wafer is rapidly reversed. As shown in FIG. 4A, if the particles have a non-zero conductivity, when the wafer surface is charged positively, charge flows within the particle in response to the electric fields emanating from the wafer, and as a result the surfaces of the particle close to the wafer accumulate negative charge and the surfaces furthest from the wafer accumulate positive charge, until the electric fields generated by the charges on the particle surfaces cancel the electric fields generated by charges in the wafer. (Here again, these charges are not removed in vacuo by mere contact between the particle and wafer.)

The speed at which a particle becomes biased as described in the previous paragraph depends on the conductivity and dielectric permeability of the particle; at lower conductivities and higher dielectric constants, it takes longer for the particle to become completely biased. However, as long as the conductivity of the particle is greater than zero, the particle will eventually become fully biased so that no electric fields appear inside of the particle.

Once all of the particles on the wafer surface have become biased in the manner discussed above, the particles can be repelled off of the surface of the wafer by rapidly inverting the charge on the wafer (e.g., turning the positive charge in the wafer into a negative charge as shown in FIG. 4B). Since the particles typically have low conductivities, the particles cannot immediately become unbiased, and as a result, the lower surfaces of the particles which contain negative charges are repelled from the negative charges in the wafer, causing the particles to bounce away from the surface of the wafer.

Thus, by operation of either or both of the above effects, particles can be removed from wafers by alternately charging the wafer positively and negatively, and generating a horizontal force (such as a gas flow) to sweep particles which are repelled from the wafer out of the chamber.

Figure 5B:
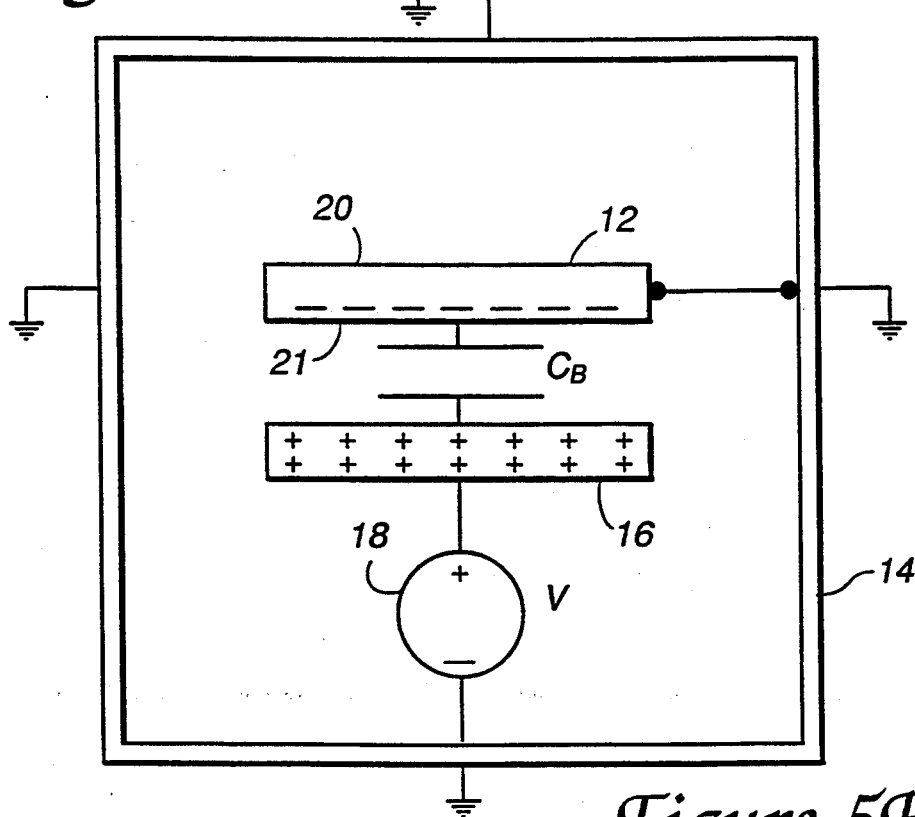

A plasma chamber 14 is diagrammatically illustrated in FIGS. 5A and 5B. The wafer 12 is situated near the center of chamber 14, and is normally not electrically connected to the walls of the chamber, which are at a ground potential.

One way to charge the wafer 12, illustrated in FIG. 5A, is to place a conductive surface 16 which is at an elevated voltage V (produced by source 18) near to, but not touching, wafer 12. If the conductive surface 16 is brought near enough to wafer 12, a strong capacitive coupling will occur between surface 16 and wafer 12. This capacitive coupling is indicated by capacitor $C_B$. The wafer is also weakly capacitively coupled to the walls of the chamber 14; this coupling is indicated by capacitors $C_S$.

Capacitors $C_B$ and $C_S$ form a capacitive voltage divider. Because the total capacitance of the capacitors $C_S$ is substantially smaller than the capacitance $C_B$, almost all of the voltage V appears on the capacitors $C_S$, and only a small amount of the voltage V appears on capacitor $C_B$. Therefore, both wafer 12 and surface 16 are at a voltage substantially equal to V.

Because wafer 12 and surface 16 are at elevated voltages, their outer faces (i.e., those faces opposite to the grounded walls of the chamber 14) will collect positive charge. Although the entire exterior of face 16 is covered with positive charge, only the outer face 20 and edges of the wafer will collect positive charge; the inner face 21 of wafer 12 (which is nearest to surface 16) will collect negative charge. Due to conservation of charge, the total positive charge accumulated on the outer face 20 and edges of the wafer will be equal to the total charge accumulated on the inner face 21 of the wafer.

Thus, if the wafer is electrically isolated from the chamber walls, by applying a positive voltage to surface 16, a positive charge can be generated on the outer face 20 of the wafer (which is the face where particles collect).

In an alternative method for charging the wafer 12, illustrated in FIG. 5A, the locations of the wafer 12 and surface 16 are the same, but the wafer is electrically connected to the wall of the chamber 14. In this situation, because the wafer 12 is at ground potential, when the wafer is exposed to positive charges on the surface 16, the inner face 21 of the wafer collects negative charge which prevent electric fields from surface 16 from entering the wafer.

Thus, if the wafer is grounded, by applying a positive voltage to surface 16, a negative charge can be generated within the wafer.

Combining the above effects, alternating positive and negative charges can be induced in the wafer by applying a large positive (or negative) voltage to surface 16, and then alternately grounding and insulating the wafer 12 relative to the walls of the chamber 14. The rapid alternation of positive and negative charge will then repel particles from the outer face 20 of the wafer so that they can be swept out of the chamber.

Figure 6A:
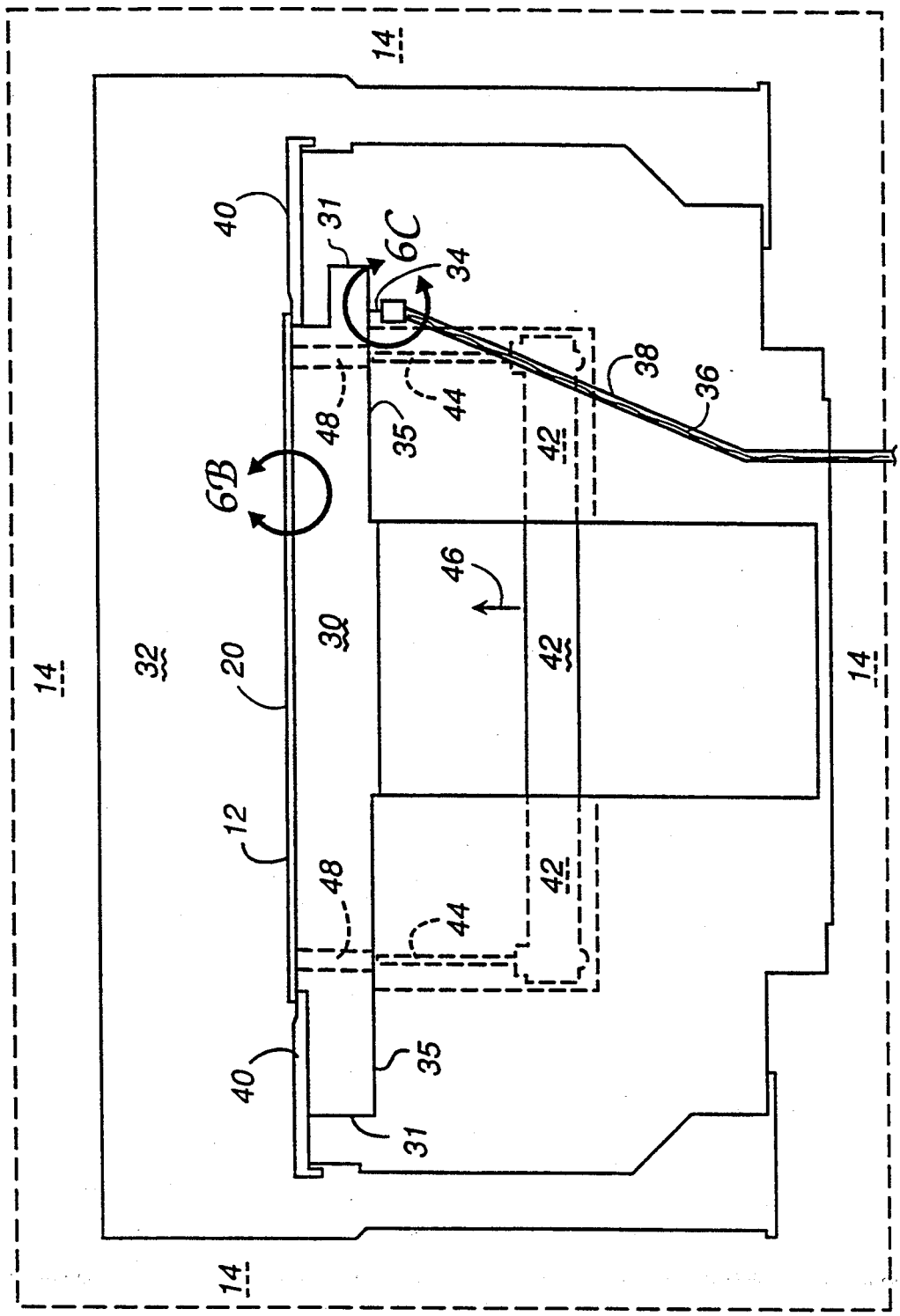
FIG. 6A illustrates a wafer fabrication chamber useful for applying the techniques of FIGS. 5A and 5B.

A cross-section of a chamber suitable for implementing the above procedure is shown in FIG. 6A. The wafer 12 sits atop a pedestal 30. Pedestal 30 is made of aluminum or some other relatively conductive and relatively non-ferromagnetic and non-paramagnetic metal (as are all other metal components in the chamber 14). Pedestal 30 and chamber walls 14 are coupled to an RF power source (not shown) which, when operating, generates high-frequency electric fields in the area 32 between the pedestal 30 and the walls of the chamber 34. As described above, during wafer processing these fields cause a gas plasma to form in area 32, leading to accumulation of ions on the upper face 20 of the wafer.

The upper face of the pedestal 30 which engages wafer 12 is covered by a conductive sheet surrounded by insulating material (illustrated in FIG. 6B, see below), which is coupled to a high voltage DC source to allow charging and discharging of the wafer. This conductive sheet wraps around the edge 31 of the pedestal 30 and across the underside 35. In a small region on the underside of the pedestal (illustrated in FIG. 6C, see below), the outer layer of insulation is removed, so that the conductive sheet can be connected to the high voltage source (not shown) via a spring-loaded contact 34 and an insulated conductor 36 which passes through a conduit 38 out of the chamber 14.

Figure 6B:
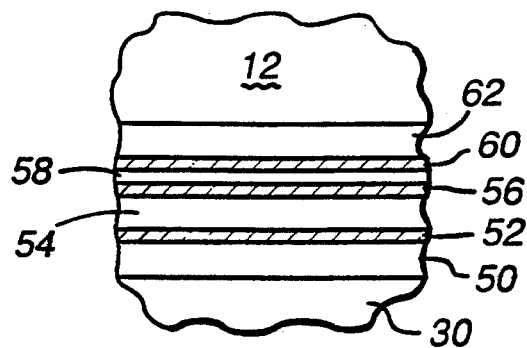
FIGS. 6B and 6C illustrate the electrostatic conductor on the faces of the pedestal of FIG. 6A.

FIG. 6B illustrates the upper face of the pedestal in greater detail. The upper face of pedestal 30 is anodized, forming a 50 $\mu$m hard layer 50 (e.g. of $Al_2O_3$). Over this hard layer 50 is a 10 $\mu$m layer 52 of epoxy adhesive, which bonds a 50 $\mu$m inner layer 54 of insulating material (e.g., a polyimide technology, available from Toshiba Corporation, 1, Komukai Toshiba-Cho, Saiwai-Ku, Kawasaki, 210 JAPAN) to the pedestal face. Another 10 $\mu$m layer of epoxy adhesive 56 bonds the high voltage conductor 58 to the outer insulating layer. The conductor is a 23 $\mu$m layer of conductive metal such as copper. This copper layer is insulated from the wafer 12 by another 10 $\mu$m layer 60 of epoxy adhesive and a 50 $\mu$m outer layer 62 of polyimide. Thus, the copper conductor 58 is insulated from both the pedestal and the wafer. Also, the lower surface of the wafer is approximately 60 $\mu$m from the high voltage DC conductor 58, providing strong capacitive coupling between the wafer and the DC conductor.

Figure 6C:
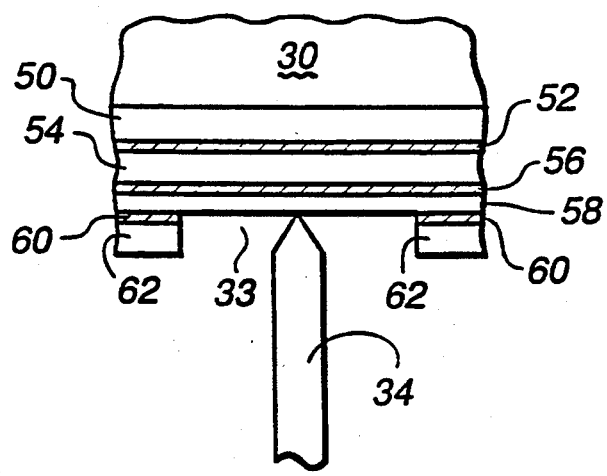

FIG. 6C illustrates region 33 on the underside of the pedestal, where the contact 34 engages the conductive sheet 58. As indicated above, in region 33 the outer layer 62 of insulation is removed, so that the conductive sheet 58 is exposed and can be contacted by the end of the spring-loaded contact 34.

The edges of the wafer are supported by an electrically insulating quartz cover 40, shown in cross-section in FIG. 6A. (The quartz cover 40 is donut-shaped; it forms a guard ring around the outside of the wafer.) Thus, the wafer is electrically insulated when resting in the position shown in FIG. 6A. As a result, a charge can be induced on the wafer by applying a large positive or negative voltage to the conductor 58 in the pedestal, making use of the capacitive voltage divider effect discussed above with reference to FIG. 5A. Applying a large positive voltage to conductor 58 causes positive charge to accumulate on the upper face 20 of wafer 12, and applying a large negative voltage to conductor 58 causes negative charge to accumulate on the upper face 20 of wafer 12.

Also shown in FIG. 6A is a lifting apparatus which is used to raise and lower the wafer 12 from and to the position shown in FIG. 6A. The lifting apparatus includes crossbars such as 42 connected between lifting pins 44 (there are two crossbars and four lifting pins; one crossbar and two lifting pins are shown in outline in FIG. 6A). When the crossbars 42 are raised in the direction of arrow 46, the lifting pins pass through apertures 48 in the pedestal 30, engage the underside of the wafer, and lift the wafer above the pedestal so that, e.g., it can be gripped and moved by a robot arm. (One robotic apparatus for moving wafers during sequential processing is described in U.S. Pat. No. 4,951,601 of Maydan et al., which is entitled "Multi-Chamber Integrated Process System", and is assigned to the assignee of this application).

The lifting apparatus is grounded; that is, it is electrically connected to the walls of the chamber 14. Thus, when the lifting pins 44 engage the underside of wafer 12, the wafer is thereby also electrically connected to the walls of the chamber 14. Therefore, to ground the wafer and change the electrical configuration from that shown in FIG. 5A to that shown in FIG. 5B, the lifting apparatus is raised until the lifting pins 44 just engage the underside of the wafer, and no further. Once in this configuration, the electrical behavior of the wafer is as shown in FIG. 5B: applying positive voltage to the conductor 58 causes negative charge to accumulate in the wafer, and applying negative voltage to the conductor 58 causes positive charge to accumulate in the wafer.

Thus, to alternately induce positive and negative charge in the wafer, and thereby repel particles from the wafer face 20, one may apply a large DC voltage to the conductor 58 and alternately move the lifting pins 44 into and out of engagement with the lower face of the wafer. Alternatively, the DC voltage applied to the conductor 58 can be alternated between a large positive and large negative value.

The high-voltage conductor 58 can be used for other purposes than those described above. For example, because applying a large DC voltage to conductor 58 induces charges in the conductor 58 and opposing charges in the lower face 21 of the wafer, when a DC voltage is applied to conductor 58 the wafer 12 and pedestal 30 are electrostatically attracted to each other. In this way, the conductor 58, when charged to a DC voltage, can be used as an electrostatic clamp which helps to grip the wafer 12 to the pedestal 30.

In addition, it has been observed that applying a large positive voltage to the conductor 58 while the plasma is operating reduces the number of particles accumulating above the wafer at the plasma sheath. (One possible explanation for this effect is that a large positive voltage in the conductor 58 tends to reshape the electric fields near the edges of the wafer and thereby alters the equipotential well which traps particles over the wafer.) Thus, using the conductor 58 as an electrostatic clamp during wafer processing may have the side effect of further reducing particulate contamination.

This invention has been disclosed with reference to a specific embodiment; however, various modifications to the embodiments described herein may be undertaken by those skilled in the art without departing from the disclosed inventive concepts. Thus, for example, the horizontal force to sweep particles away from the substrate may be horizontal magnetic field which imparts Lorentz-law horizontal forces on vertically-moving particles. The above description should therefore be taken as exemplary and not limiting.

What is claimed is:

1. A method of reducing particle contamination of a face of a substrate in a plasma processing chamber, comprising:
    alternately inducing a positive and negative charge in said substrate in a manner which does not require the generation of a gas plasma above the substrate, thereby repelling particles from said substrate, and
    producing a force parallel to said face of said substrate to sweep said particles away from said substrate.

2. The method of claim 1 wherein alternately inducing positive and negative charges in said substrate comprises:
    bringing said substrate into close proximity to an electrically conductive surface so that said substrate is substantially more strongly capacitively coupled to said surface than to any wall of said chamber,
    applying a voltage to said conductive surface, and
    switching polarity of the voltage applied to said conductive surface.

3. The method of claim 1 wherein alternately inducing positive and negative charge in said substrate comprises:
    bringing said substrate into close proximity to an electrically conductive surface so that said substrate is substantially more strongly capacitively coupled to said surface than to any wall of said chamber,
    applying a voltage to said conductive surface, and
    alternately grounding said substrate and leaving said substrate ungrounded.

4. The method of claim 3 wherein grounding said substrate with an electrically grounded actuator configured to participate in moving said substrate within said chamber.

5. The method of claim 1 wherein producing a force parallel to said face of said substrate comprises flowing gas through said chamber at a rate substantially higher than a rate used during plasma processing.

6. The method of claim 1 wherein producing a force parallel to said face of said substrate comprises producing a magnetic field which imparts said force on particles moving perpendicular to said face of said substrate.

7. The method of claim 3 wherein grounding said substrate comprises contacting said substrate with an electrically grounded actuator configured to participate in moving said substrate within said chamber.

8. Apparatus for reducing particle contamination of a face of a substrate in a plasma processing chamber, comprising:
    means for inducing an alternating negative and positive charge in said substrate and thereby repelling particles from said substrate comprising a conductive surface in close proximity to said substrate, said substrate being substantially more strongly capacitively coupled to said conductive surface than to any wall of said chamber, and
    means for producing a force parallel to said substrate to sweep said particles away from said substrate.

9. The apparatus of claim 8 wherein said means for inducing an alternating charge in said substrate further comprises
    means for applying an alternating voltage to said conductive surface.

10. The apparatus of claim 8 wherein said means for inducing an alternating charge in said substrate further comprises
   means for applying a voltage to said conductive surface, and
   means for alternately grounding said substrate and leaving said substrate ungrounded.

11. The apparatus of claim 10 wherein said means for grounding said substrate comprises an electrical ground actuator configured to participate in moving said substrate within said chamber.

12. The apparatus of claim 8 wherein said means for producing a force parallel to said face of said substrate flows gas through said chamber at a rate substantially higher than a rate used during plasma processing.

13. The apparatus of claim 8 wherein said means for producing a force parallel to said face of said substrate produces a magnetic field which imparts said force on particles moving perpendicular to said face of said substrate.

* * * * *